(12) United States Patent
Kwon et al.

(10) Patent No.: US 11,870,454 B2
(45) Date of Patent: Jan. 9, 2024

(54) ANALOG TO DIGITAL CONVERTER

(71) Applicant: LG ELECTRONICS INC., Seoul (KR)

(72) Inventors: Yigi Kwon, Seoul (KR); Byoung Han Min, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/792,803

(22) PCT Filed: Jan. 15, 2020

(86) PCT No.: PCT/KR2020/000756
§ 371 (c)(1),
(2) Date: Jul. 14, 2022

(87) PCT Pub. No.: WO2021/145480
PCT Pub. Date: Jul. 22, 2021

(65) Prior Publication Data
US 2023/0040581 A1    Feb. 9, 2023

(51) Int. Cl.
*H03M 1/12* (2006.01)
*H03M 1/16* (2006.01)
*H03M 1/18* (2006.01)
*H03M 1/50* (2006.01)
*H03M 1/46* (2006.01)

(52) U.S. Cl.
CPC ............ *H03M 1/16* (2013.01); *H03M 1/181* (2013.01); *H03M 1/504* (2013.01); *H03M 1/466* (2013.01)

(58) Field of Classification Search
CPC ........ H03M 1/16; H03M 1/181; H03M 1/504; H03M 1/466
See application file for complete search history.

(56) References Cited

U.S. PATENT DOCUMENTS

| | | | |
|---|---|---|---|
| 5,644,313 A | 7/1997 | Rakers et al. | |
| 6,535,157 B1 | 3/2003 | Garrity et al. | |
| 7,583,219 B2 | 9/2009 | Jeon et al. | |
| 7,880,659 B2 | 2/2011 | Lee | |
| 9,106,240 B1 | 8/2015 | Lien | |
| 9,386,240 B1 * | 7/2016 | Johansson | H04N 25/771 |
| 2009/0033530 A1 | 2/2009 | Jeon et al. | |
| 2009/0085790 A1 | 4/2009 | Lee | |
| 2015/0214969 A1 | 7/2015 | Lien | |

FOREIGN PATENT DOCUMENTS

| | | |
|---|---|---|
| KR | 10-2009-0013312 A | 2/2009 |
| KR | 10-2010-0077300 A | 7/2010 |
| KR | 10-2010-0081476 A | 7/2010 |

* cited by examiner

*Primary Examiner* — Joseph J Lauture
(74) *Attorney, Agent, or Firm* — Birch, Stewart, Kolasch & Birch, LLP (57) ABSTRACT

According to one embodiment of the present invention, provided is an analog to digital converter. The analog-to-digital converter according to one embodiment of the present invention comprises an analog amplification unit and a flash conversion unit, wherein the analog amplification unit may have a structure in which in which two input terminal circuits that alternately operate share a single amplifier. Accordingly, the analog-to-digital converter according to one embodiment of the present invention can be implemented in a smaller area and operate at low power, and can have a high resolution while operating at a high speed.

16 Claims, 8 Drawing Sheets

ANALOG TO DIGITAL CONVERTER

CROSS REFERENCE TO RELATED APPLICATIONS

This application is the National Phase of PCT International Application No. PCT/KR2020/000756, filed on Jan. 15, 2020, all of which is hereby expressly incorporated by reference into the present application.

TECHNICAL FIELD

The present disclosure relates to an analog to digital converter that may reduce chip area and power consumption.

BACKGROUND ART

Recently, System-on-Chip for various applications such as digital television and digital camera has been widely used. System on a Chip (or System-on-Chip) includes an analog-to-digital converter configured to receive and convert an analog signal into a digital signal.

In addition, low power and small circuit area are important design factors for System-on-Chip. For the analog-to-digital converters, it is very important to have low power and small circuit area. Also, to realize a high-performance application, analog-to-digital converters need to have high resolution while operating at higher speeds.

DESCRIPTION OF INVENTION

Technical Problems

Accordingly, an object of the present disclosure is to address the above-noted and other problems and to provide an analog-to-digital converter that may be implemented in a small area.

Another object of the present disclosure is to provide an analog-to-digital converter that may operate with low power.

A further object of the present disclosure is to provide an analog-to-digital converter that may have high resolution while operating at a high speed.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

Technical Solutions

The analog-to-digital converter according to an embodiment of the present disclosure may be implemented in a small area.

The analog-to-digital converter may operate with low power.

The analog-to-digital converter may have high resolution while operating at a high speed.

According to one embodiment of the present invention, provided is an analog to digital converter. The analog-to-digital converter according to one embodiment of the present invention comprises an analog amplification unit and a flash conversion unit. The analog amplification unit may have a structure in which in which two input terminal circuits that alternately operate share a single amplifier.

An analog-to-digital converter according to an embodiment may include an analog amplification unit configured to input an input signal and sequentially output first output signals, the analog amplification unit in which the n-th output first output signal (where n is an integer greater than or equal to 2) is a signal obtained by subtracting a value corresponding to the second output signal converted from the n-th output first output signal is amplified; and a flash conversion unit configured to input the first output signal, output the second output signal, and generate and output an output code based on the second output signal. The analog amplification unit may include a first input unit configured to output a first intermediate signal in response to the first output signal and the odd numbered output second output signal; a second input unit configured to output a second intermediate signal in response to the first output signal and the even numbered output second output signal; and an amplifier configured to output the first output signal by amplifying the first intermediate signal in even numbered time periods, and output the first output signal by amplifying the second intermediate signal in odd numbered time periods.

The analog amplification unit may further include a selection unit configured to output one of the input signal and the first output signal as a selection input signal in response to a selection control signal.

The input signal may include a first input signal and a second input signal, the first intermediate signal comprises a 1-1 intermediate signal and a 1-2 intermediate signal. The first input unit may include a plurality of first switches each having one end connected to a terminal to which a first reference voltage is applied and configured to be turned on and off in response to a corresponding bit signal among the odd numbered output second output signals; a plurality of second switches each having one end connected to a terminal to which a second reference voltage is applied and the other end connected to the other end of a corresponding one among the plurality of the first switches, and configured to be turned on and off in response to a corresponding bit signal among bit-inverted signals with respect to the odd numbered output second signal; a plurality of first capacitors each connected between a first node where the first input signal is input and the 1-1 intermediate signal is output and the other end of each of the first switches; a plurality of third switches each having one end connected to a terminal to which a first reference voltage is applied and configured to be turned on and off in response to a corresponding bit signal among the odd numbered output second output signals; a plurality of fourth switches each having one end connected to a terminal to which a second reference voltage is applied and the other end connected to the other end of a corresponding one among the plurality of the third switches, and configured to be turned on and off in response to a corresponding bit signal among the odd numbered output second output signals; and a plurality of second capacitors each connected between a second node where the second input signal is input and the 1-2 intermediate signal is output and the other end of each of the third switches.

The input signal may include a first input signal and a second input signal, the second intermediate signal comprises a 2-1 intermediate signal and a 2-2 intermediate signal. The second input unit may include a plurality of first switches each having one end connected to a terminal to which a first reference voltage is applied and configured to be turned on and off in response to a corresponding bit signal among the even numbered output second output signals; a plurality of second switches each having one end connected to a terminal to which a second reference voltage is applied and the other end connected to the other end of a corresponding one among the plurality of the first switches, and configured to be turned on and off in response to a corresponding bit signal among bit-inverted signals with respect to the even numbered output second signal; a plurality of first capacitors each connected between a first node where the second input signal is input and the 2-1 intermediate signal is output and the other end of each of the first switches; a plurality of third switches each having one end connected to a terminal to which a first reference voltage is applied and configured to be turned on and off in response to a corresponding bit signal among the odd numbered output second output signals; a plurality of fourth switches each having one end connected to a terminal to which a second reference voltage is applied and the other end connected to the other end of a corresponding one among the plurality of the third switches, and configured to be turned on and off in response to a corresponding bit signal among the even numbered output second output signals; and a plurality of second capacitors each connected between a second node where the second input signal is input and the 2-2 intermediate signal is output and the other end of each of the third switches.

The first intermediate signal may include a 1-1 intermediate signal and a 1-2 intermediate signal. The second intermediate signal may include a 2-1 intermediate signal and a 2-2 intermediate signal, and the first output signal comprises a 1-1 output signal and 1-2 output signal. The amplification unit may include an amplifier comprising a 1-1 input terminal to which the 1-1 intermediate signal is input, a 1-2 input terminal to which the 1-2 intermediate signal is input, a 2-1 input terminal to which the 2-1 intermediate signal is input, a 2-2 input terminal to which the 2-2 intermediate signal is input, a first output terminal to which the 1-1 output signal is output, and a second output terminal to which the 1-2 output signal is output; a first capacitor and a first switch that are connected in series between the 1-1 input terminal and the first output terminal; a second capacitor and a second switch that are connected in series between the 1-2 input terminal and the second output terminal; a third capacitor and a third switch that are connected in series between the 2-1 input terminal and the first output terminal; and a fourth capacitor and a fourth switch that are connected in series between the 2-2 input terminal and the second output terminal. The first switch and the second switch may be turned off in odd numbered time periods and turned on in the even numbered time periods.

The amplifier may include a folded cascade amplification circuit configured to amplify a difference between the 1-1 intermediate signal and the 1-2 intermediate signal in the even numbered time periods and a difference between the 2-1 intermediate signal and the 2-2 intermediate signal in odd numbered time periods and output; and a common sources amplification circuit configured to amplify an output signal of the folded cascade amplification circuit and output the 1-1 output signal and the 1-2 output signal.

The folded cascade amplification circuit may include an input end circuit configured to vary signals of intermediate nodes in response to the 1-1 intermediate signal and the 1-2 intermediate signal in the even numbered time periods and vary signals of the intermediate nodes in response to the 2-1 intermediate signal and the 2-2 intermediate signal in the odd numbered time periods; and an output end circuit configured to amplify and output a voltage difference between the intermediate nodes.

The input end circuit may include a first transistor connected between a terminal to which a first voltage is applied and a first node; a first switch having one end connected to the first node and configured to be turned on in the even numbered time periods and turned off in the odd numbered time periods; a second transistor connected between the other end of the first switch and a second node, and comprising a gate to which the 1-1 intermediate signal is applied; a third transistor connected between the other end of the first switch and a third node, and configured to have the 1-2 intermediate signal applied thereto; a second switch having one end connected to the first node and configured to be turned on in the odd numbered time periods and turned off in the even numbered time periods; a fourth transistor connected between the other end of the second switch and the third node, and comprising a gate to which the 2-1 intermediate signal is applied; and a fifth transistor connected between the other end of the second switch and the second node, and comprising a fifth transistor to which the 2-2 intermediate signal is applied.

The input end circuit of the analog-to-digital converter may further include a current source and a third switch that are connected in series between the first node and the terminal to which the first voltage is input.

The output end circuit may include a sixth transistor connected between a terminal to which the second voltage is applied and the second node; a seventh transistor connected between a terminal to which the second voltage is applied and the third node; an eighth transistor connected between the second node and the fourth node; a ninth transistor connected between the third node and fifth node; a tenth transistor connected between the fourth node and the terminal to which the first voltage is applied; and an eleventh transistor connected between the fifth node and the terminal to which the first voltage is applied.

The output end circuit may further include a third switch connected in series between the terminal to which the second voltage is applied and the second node; and a fourth switch connected in series between the terminal to which the second voltage is applied and the third node.

The common source amplification circuit of the analog-to-digital converter may include a twelfth transistor connected between a terminal to which the second voltage is applied and a terminal to which the 1-1 output signal is output; a thirteenth transistor connected between the terminal to which the second voltage is applied and a terminal to which 1-2 output signal is output; a fourteenth transistor connected between the terminal to which the 1-1 output signal is output and a sixth node, and comprising a gate to which a signal of the fourth node is applied; a fifteenth transistor connected between a terminal to which the 1-2 output signal is output and the sixth node; and a sixteenth transistor connected between the sixth node and the terminal to which the first voltage is applied.

The common source amplification circuit of the analog-to-digital converter according to an embodiment may include a first current source and a third switch that are connected in series between the terminal to which the second voltage is applied and the terminal to which the 1-1 output signal is output; and a second current source and a fourth switch that are connected in series between the terminal to which the second voltage is applied and the terminal to which the 1-2 output signal is output.

The common source amplification circuit of the analog-to-digital converter according to an embodiment may further include a first current source and a third switch that are connected in series between a terminal to which the first voltage is applied and the sixth node.

Advantageous Effect

The analog-to-digital converter according to an embodiment of the present disclosure may be implemented in a smaller area.

In addition, the analog-to-digital converter may operate with low power.

In addition, the analog-to-digital converter may have high resolution while operating at a high speed.

Specific effects are described along with the above-described effects in the section of Detailed Description.

DETAILED DESCRIPTION OF EXEMPLARY EMBODIMENT

The above-described aspects, features and advantages are specifically described hereunder with reference to the accompanying drawings such that one having ordinary skill in the art to which the present disclosure pertains can easily implement the technical spirit of the disclosure. In the disclosure, detailed descriptions of known technologies in relation to the disclosure are omitted if they are deemed to make the gist of the disclosure unnecessarily vague. Below, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components should not be limited by the terms. Certainly, a first component can be a second component unless stated to the contrary.

It will be understood that when an element is referred to as being "connected with" or "coupled to" another element, the element can be directly connected with the other element or intervening elements may also be present. In contrast, when an element is referred to as being "directly connected with" another element, there are no intervening elements present.

Throughout the specification, unless otherwise stated, each element may be singular or plural.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Throughout the disclosure, the terms "A and/or B" as used herein can denote A, B or A and B, and the terms "C to D" can denote C or greater and D or less, unless stated to the contrary.

Hereinafter, an analog-to-digital converter according to embodiments of the present disclosure will be described.

Figure 1:
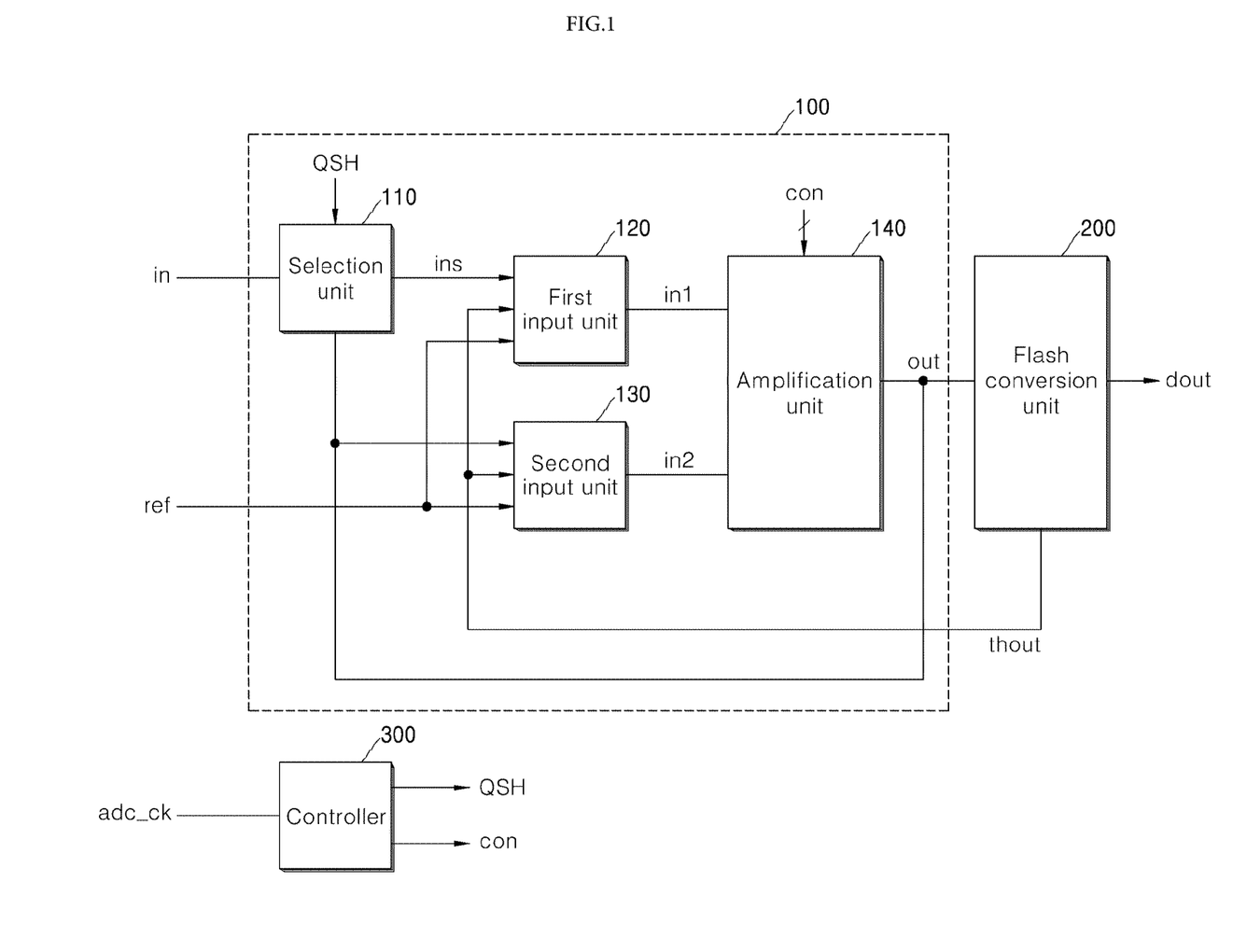
FIG. 1 is a block view schematically showing a configuration of an analog-to-digital converter according to an embodiment of the present disclosure.

FIG. 1 is a block view schematically showing a configuration of an analog-to-digital converter according to an embodiment of the present disclosure. The analog-to-digital converter according to the embodiment may include an analog amplification unit 100, a flash converter 200 and a controller 300. The analog amplification unit 100 may include a selector 110, a first input unit 120, a second input unit 130 and an amplification unit 140.

The analog amplification unit 100 may input an input signal (in) and sequentially output first output signals (out). Here, the first output signals (out) that are output sequentially may be residual voltage signals. In other words, the analog amplification unit 100 may subtract a value corresponding to a second output signal, which is a digital value converted from the previously output first output signal (out), from the input signal (in) or the previously output first output signal (out), and amplify and output the subtracted value. The amplification and conversion unit may be MDAC (Multiplying Digital to Analog Converter.

The selection unit 110 may be configured to select one of the input signal (in) and the first output signal (out) in response to a selection control signal (QSH) output from the controller 300, and to output the selected signal as a select input signal (ins).

The first input unit 120 may be configured to receive a first intermediate signal (in1) in response to a selection input signal (ins), a first output signal (out), a reference signal (ref) and a second output signal (thout).

The second input unit 130 may be configured to output a second intermediate signal (in2) in response to a first output signal (out), a reference signal (ref) and a second output signal (thout).

The amplification unit 140 may be configured to sequentially amplify the first intermediate signal (in1) and the second intermediate signal (in2) in response to an amplification control signal (con) output from the controller 300, and output the first output signal by repeating the amplifying a predetermined number of times.

Here, the reference signal (ref) may be a reference voltage and the second output signal (thout) may be a digital code.

Detailed structures and operations of the selection unit 110, the first input unit 120, the second input unit 130 and the amplification unit 140 will be described later.

The flash conversion unit 200 may input the first output signal (out) and convert it into a digital signal, and generate the second output signal (thout) based on the converted digital signal. The flash conversion unit 200 may also correct and combine an error of the second output signal (thout) and generate and output an output code (dout).

Detailed structure and operation of the flash conversion unit 200 will be described later.

The controller may input a clock signal (adc_ck) and output a selection control signal (QSH) and an amplification control signal (con).

Figure 2:
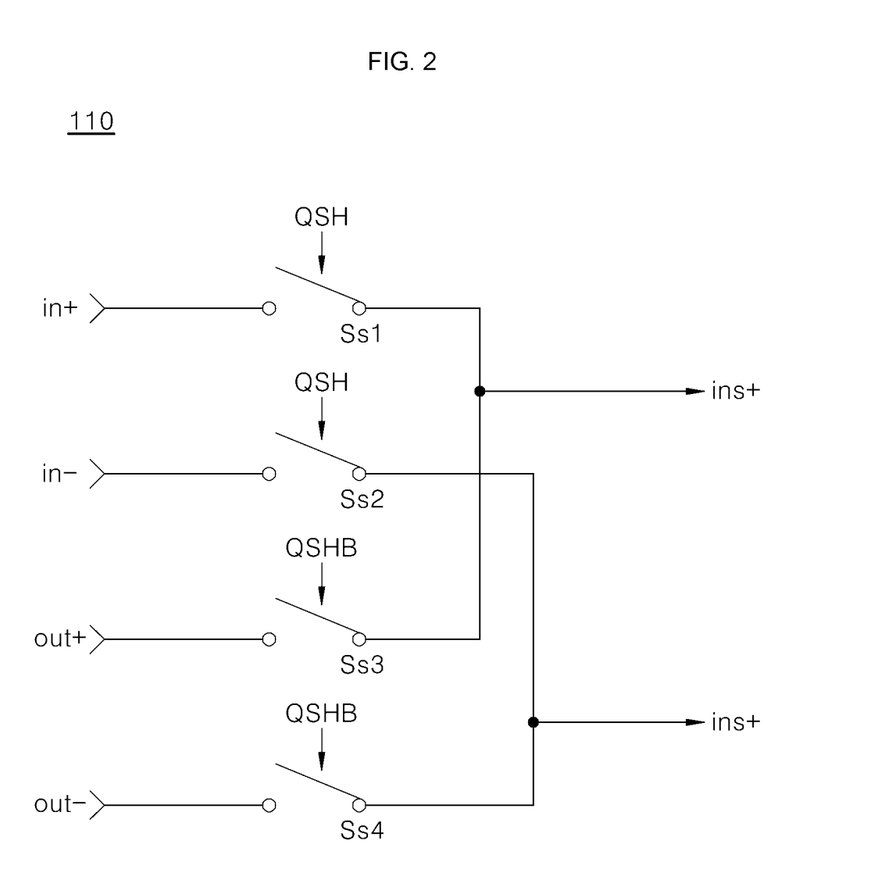
FIG. 2 is a view schematically showing a configuration of a selection unit according to an embodiment that is provided in the analog-to-digital converter shown in FIG. 1.

FIG. 2 is a view schematically showing the configuration of the selection unit 110 according to an embodiment that is provided in the analog-to-digital converter shown in FIG. 1. The selection unit 110 may include a plurality of selection switches (Ss1, Ss2, Ss3 and Ss4).

The input signal (in) of FIG. 1 may include a first input signal (in+) and a second input signal (in−). The first output signal of FIG. 1 may include a 1-1 output signal (out+) and a 1-2 output signal (out−). The selection input signal (ins) may include a first selection input signal (ins+) and a second selection input signal (ins−).

The first selection switch (Ss1) may be connected between a terminal to which the first input signal (in+) is input and another terminal to which the first selection input signal (ins+) is output, and may be turned on and off in response to the selection control signal (QSH).

The second selection switch (Ss2) may be connected between a terminal to which the second input signal (in−) is input and another terminal to which the second selection input signal (ins−) is output, and may be turned on and off in response to the selection control signal (QSH).

The third selection switch (Ss3) may be connected between a terminal to which the 1-1 output signal is input and another terminal to which the first selection input signal (ins+) is output, and may be turned on and off in response to an inversion selection control signal (QSHB).

The fourth selection switch (Ss4) may be connected between a terminal to which the 1-2 output signal (out−) is input and another terminal to which the second selection input signal (ins−) is output, and may be turned on and off in response to the inversion selection control signal (QSHB).

Specifically, when the selection control signal (QSH) is a high level signal, that is, when the inversion selection control signal (QSHB) is a low level signal), the selection unit 110 may output the first input signal (in+) and the second input signal (in−) as the first selection input signal (ins+) and the second selection input signal (ins−), respectively. When the selection control signal (QSH) is a low level signal, that is, when the inversion selection control signal (QSHB) is a high level signal, the selection unit 110 may output the 1-1 output signal (out+) and the 1-2 output signal (out−) as the first selection input signal (ins+) and the second selection input signal (ins−), respectively.

Figure 3:
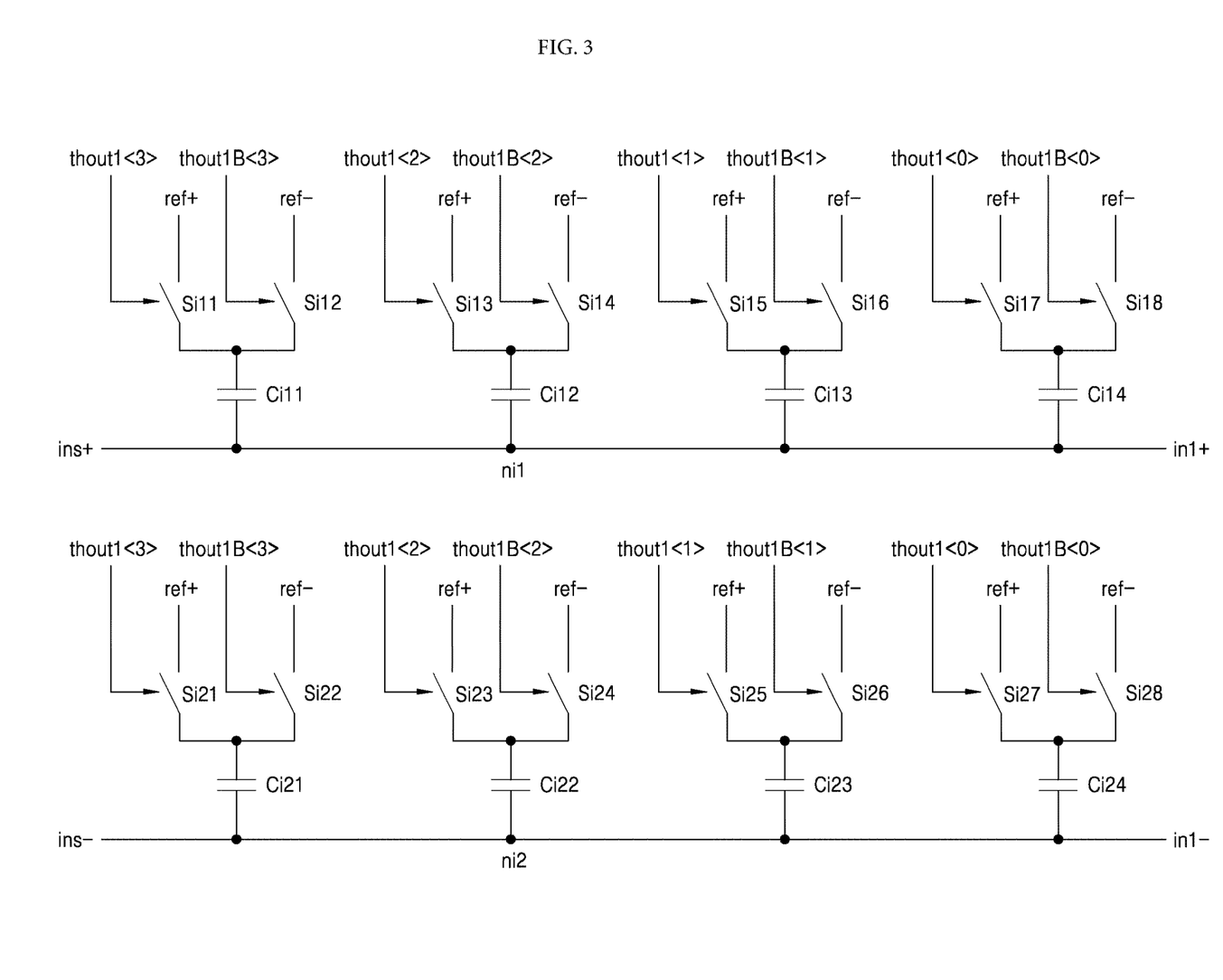
FIG. 3 is a view schematically showing a configuration of a first input unit according to an embodiment that is provided in the analog-to-digital converter shown in FIG. 1.

FIG. 3 is a view schematically showing a configuration of a first input unit according to an embodiment that is provided in the analog-to-digital converter shown in FIG. 1;

The first intermediate signal (in1) of FIG. 1 may include a 1-1 intermediate signal (in1+) and a 1-2 intermediate signal (in1−).

Each of the switches (Si11, Si13, Si15 and Si17) may have one end connected to a terminal to which the first reference voltage (ref+) is applied, and may be turned on and off in response to a corresponding bit signal among the 2-1 output signals (thout1<3:0>) output from the flash amplification unit (200, see FIG. 1) in the previous time period. Each of the switches (Si12, Si14, Si16 and Si18) may have one end connected to a terminal to which a second reference voltage (ref−) is applied, and may be turned on and off in response to a corresponding bit signal among the 2-1 inversion output signals (thoutB1<3:0>) output from the flash amplification unit (200, see FIG. 1) in the previous time period. Each of the switches (Si11, Si13, Si15 and Si17) may have the other end connected to the other end of each of the switches (Si12, Si14, Si16 and Si18). Each of the capacitors (Ci11, Ci12, Ci13 and Ci14) may be connected between the other end of each of the switches (Si11, Si13, Si15 and Si17) and a node (ni1). The first selection input signal (ins+) may be input to a node (ni1) and a signal of the node (ni1) may be output as a 1-1 intermediate signal (in1+).

Each of the switches (Si21, Si23, Si25 and Si27) may have one end connected to a terminal to which a first reference voltage (ref+) is applied, and may be turned on and off in response to a corresponding bit signal among the 2-1 output signals (thout<3:0>) output from the flash amplification unit (200, see FIG. 1) in the previous time period. Each of the switches (Si22, Si24, Si26 and Si28) may have one end connected to a terminal to which a second reference voltage (ref−) is applied, and may be turned on and off in response to a corresponding bit signal among the 2-1 inversion output signals (thout1B<3:0>) output from the flash amplification unit (200, see FIG. 1) in the previous time period. The other end of each of the switches (Si21, Si23, Si25 and Si27) may be connected to the other end of each of the switches (Si22, Si24, Si26 and Si28). Each of the capacitors (Ci21, Ci22, Ci23 and Ci24) may be connected between the other end of each of the switches (Si21, Si23, Si25 and Si27) and a node (ni2). The second selection input signal (ins−) may be input to a node (ni2) and a signal of the node (ni2) may be output as a 1-2 intermediate signal (in1−).

Figure 4:
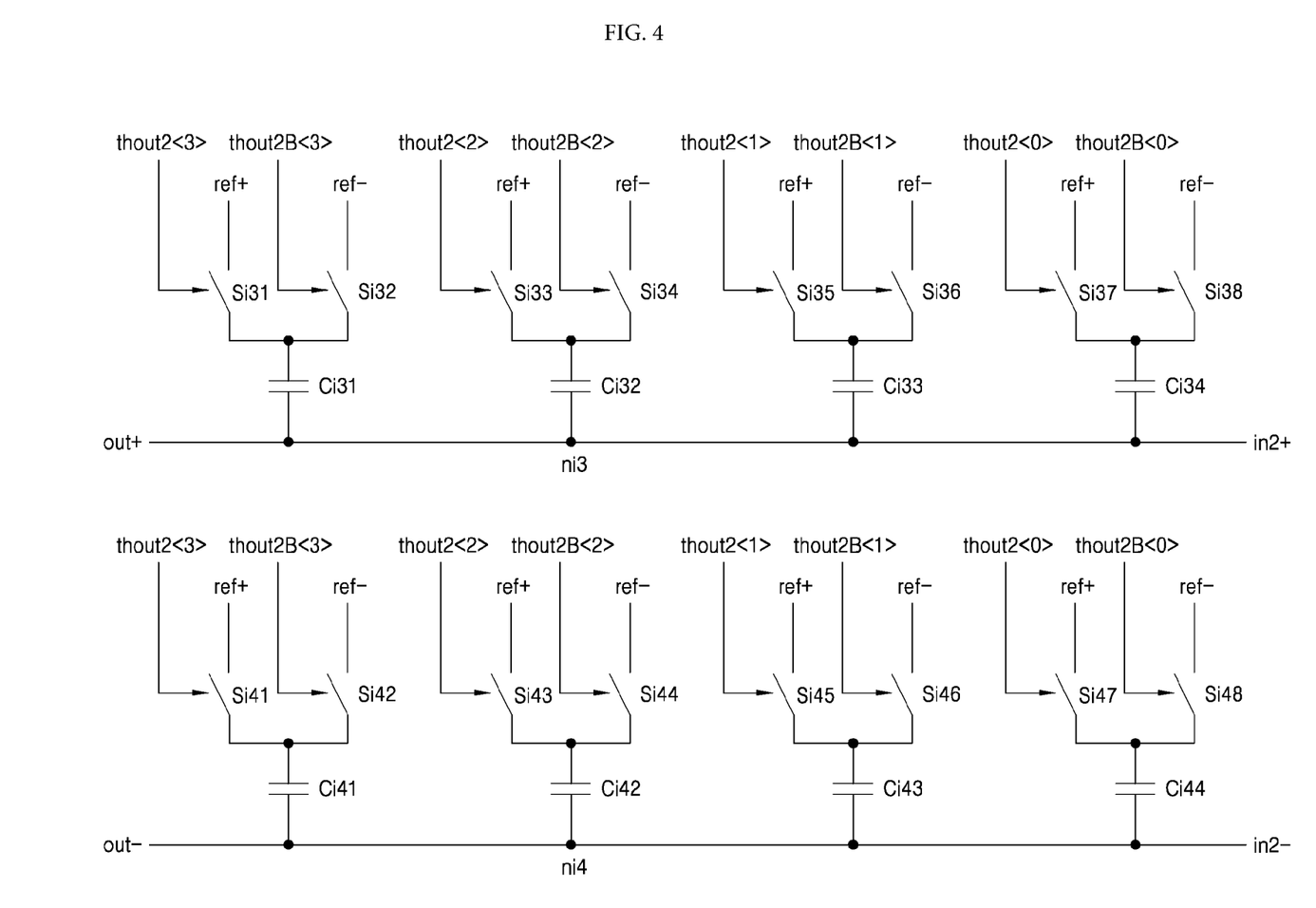
FIG. 4 is a view schematically showing a configuration of a second input unit according to an embodiment that is provided in the analog-to-digital converter shown in FIG. 1.

FIG. 4 is a view schematically showing a configuration of a second input unit according to an embodiment that is provided in the analog-to-digital converter shown in FIG. 1. The second input unit 130 may include a plurality of capacitors (Ci31 to Ci34 and Ci41 to Ci44) and a plurality of switches (Si31 to Si38 and Si41 to Si48).

The second intermediate signal (in2) of FIG. 1 may include a 2-1 intermediate signal (in2+) and a 2-2 intermediate signal (in2+).

Each of the switches (Si31, Si33, Si35 and Si37) may have one end connected to a terminal to which a first reference voltage (ref+) is applied, and may be turned on and off in response to a corresponding bit signal among the 2-2 output signals (thout2<3:0>) output from the flash amplification unit (200, see FIG. 1) in the previous time period. Each of the switches (Si32, Si34, Si36 and Si38) may have one end connected to a terminal to which a second reference voltage (ref−) is applied, and may be turned on and off in response to a corresponding bit signal among the 2-2 inversion output signals (thout2B<3:0>) output from the flash amplification unit (200, see FIG. 1) in the previous time period. The other end of each of the switches (Si31, Si33, Si35 and Si37) may be connected to the other end of each of the switches (Si32, Si34, Si36 and Si38). Each of the capacitors (Ci31, Ci32, Ci33 and Ci34) may be connected between the other end of each of the switches Si31, Si33, Si35 and Si37) and a node (ni3). The 1-1 output signal (out+) may be input to a node (ni3) and a signal of the node (ni3) may be output as a 2-1 intermediate signal (in2+).

Each of the switches (Si41, Si43, Si45 and Si47) may have one end connected to a terminal to which a first reference voltage (ref+) is applied, and may be turned on and off in response to a corresponding bit signal among the 2-2 output signals (thout<3:0>) output from the flash amplification unit (200, see FIG. 1) in the previous time period. Each of the switches (Si42, Si44, Si46 and Si48) may have one end connected to a terminal to which a second reference voltage (ref−) is applied, and may be turned on and off in response to a corresponding bit signal among the 2-2 inversion output signals (tout2B<3:0>) output from the flash amplification unit (200, see FIG. 1) in the previous time period. The other end of each of the switches (Si41, Si43, Si45 and Si47) may be connected to the other end of each of the switches (S942, Si44, Si46 and Si48). Each of the capacitors (Ci41, Ci42, Ci43 and Ci44) may be connected between the other end of each switch (Si41, Si43, Si45 and Si47) and a node (ni4). The 1-2 output signal (out−) may be input to the node (ni4) and a signal of the node (ni4) may be output as a 2-2 intermediate signal (in2−).

FIGS. 3 and 4 show that each of the 2-1 output signal (thout1<3:0>) and the 2-2 output signal (thout2<3:0>) is a 4-bit digital code. However, the number of bits of the 2-1 output signal and the 2-2 output signal may be adjusted as necessary.

Figure 5:
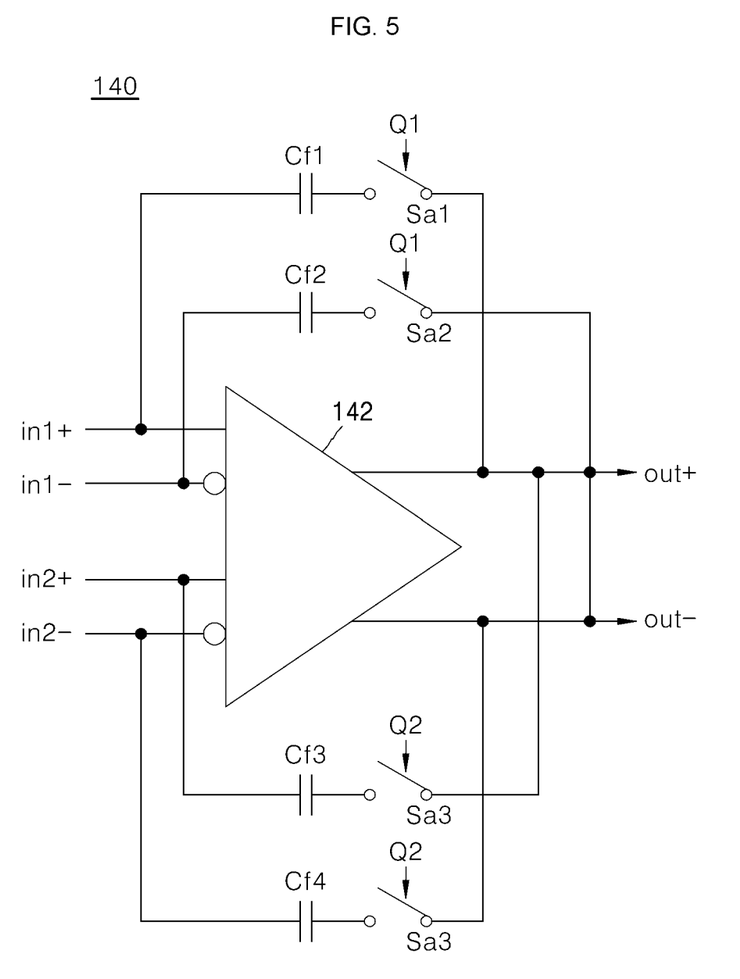
FIG. 5 is a view schematically showing a configuration of an amplification unit according to an embodiment that is provided in the analog-to-digital converter shown in FIG. 1.

FIG. 5 is a view schematically showing a configuration of an amplification unit according to an embodiment that is provided in the analog-to-digital converter shown in FIG. 1. The amplification unit 140 may include an amplifier 142 and capacitors (Cf1, Cf2, Cf3 and Cf4) and switches (Sa1, Sa2, Sa3 and Sa4).

The amplifier 142 may include a 1-1 input terminal to which a 1-1 intermediate signal (in1+) is input, a 1-2 input terminal to which a 1-2 intermediate signal (in1−) is input, a 2-1 input terminal to which a 2-1 intermediate signal (in2+) is input, a 2-2 input terminal to which a 2-2 intermediate signal (in2−) is input, a first output terminal to which a first output signal (out+) is output, and a second output terminal to which a second output signal (out−) is output.

The capacitor (Cf1) and the switch (Sa1) may be connected in series between the 1-1 input terminal and the first output terminal. The capacitor (Cf2) and the switch (Sa2) may be connected in series between the 1-2 input terminal and the second output terminal. The capacitor (Cf3) and the switch (Sa3) may be connected in series between the 2-1 input terminal and the first output terminal. The capacitor (Cf4) and the switch (Sa4) may be connected in series between the 2-2 input terminal and the second output terminal. The switches (Sa1 and Sa2) may be turned on and off in response to a first amplification control signal (Q1), and the switches (Sa3 and Sa4) may be turned on and off in response to a second amplification control signal (Q2). The first amplification control signal (Q1) and the second amplification control signal (Q2) may be output from the controller (300, see FIG. 1). That is, a control signal (con, see FIG. 1) output by the controller (300, see FIG. 1) may include the first amplification control signal (Q1) and the second amplification control signal (Q2).

Figure 6:
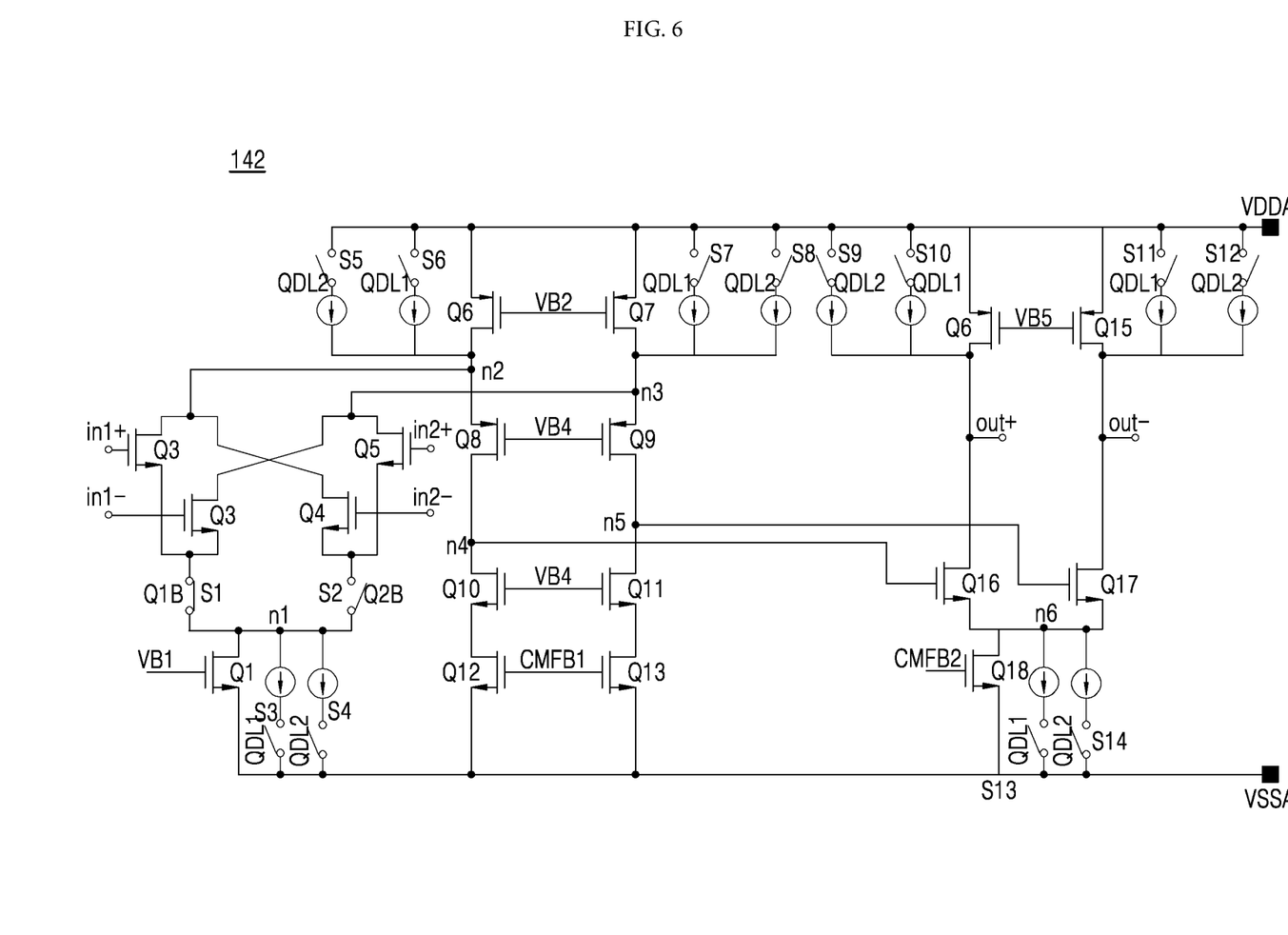
FIG. 6 is a view schematically showing a configuration of an amplifier according to an embodiment that is provided in the analog-to-digital converter shown in FIG. 1.

FIG. 6 is a view schematically showing a configuration of an amplifier 142 according to an embodiment that is provided in the analog-to-digital converter shown in FIG. 1. The amplifier 142 may include a plurality of transistors (Q1 to Q18), a plurality of switches (S1 to S14), and a plurality of current sources. In FIG. 6, VB1, VB2, VB3, VB4, VB5, CMFB1 and CMFB2 may be each a bias voltage that holds an operating point of a corresponding transistor.

The plurality of transistors (Q1 to Q13) may function as folded cascade amplifier. The plurality of transistors (Q14 to Q18) may function as common course amplifier. In other words, the amplifier 142 may include the folded cascade amplifier having the plurality of transistors (Q1 to Q12) and the common source amplifier having the plurality of transistors (Q13 to Q17).

The switches (S1 and S2) may function as switches for selecting the input signal. The switches (S3 to S14) may function as switches for reducing unnecessary power consumption.

The transistor Q1 may be connected between a terminal to which a first voltage (VSSA) is applied and a node (n1).

One end of the switch (S1) may be connected to the node (n1).

The transistor (Q2) may be connected between the other end of the switch (S1) and a node (n3), and may include a gate to which a 1-1 intermediate signal (in1+) is applied.

The transistor (Q3) may be connected between the other end of the switch (S1) and a node (n2), and may include a gate to which a 1-2 intermediate signal (in1−) is applied.

One end of the switch (S2) may be connected to a node (n1).

The transistor (Q4) may be connected between the other end of the switch (S2) and a node (n2), and may include a gate to which a 2-1 intermediate signal (in2+) is applied.

The transistor (Q5) may be connected between the other end of the switch (S2) and a node (n3), and may include a gate to which a 2-2 intermediate signal (in2−) is applied.

The transistor (Q6) may be connected between a terminal to which a second voltage (VDDA) is applied and a node (n2).

The transistor (Q7) may be connected between a terminal to which a second voltage (VDDA) is applied and a node (n3).

The transistor (Q8) may be connected between a node (n2) and a node (n4).

The transistor (Q9) may be connected between a node (n3) and a node (n5).

The transistors (Q10 and Q12) may be connected in series between a node (n4) and a terminal to which a first voltage (VSSA) is applied.

The transistors (Q11 and Q13) may be connected in series between a node (n5) and a terminal to which a first voltage (VSSA) is applied.

The transistor (Q14) may be connected between a terminal to which a second voltage (VDDA) is applied and a terminal to which a first output signal (out+) is output.

The transistor (Q15) may be connected between a terminal to which a second voltage (VDDA) is applied and a terminal to which a second output signal (out−) is output.

The transistor (Q16) may be connected between a terminal to which a first output signal (out+) is output and a node (n6).

The transistor (Q17) may be connected between a terminal to which a second output signal (out−) is output and a node (n6).

The transistor (Q18) may be connected between a node (n6) and a terminal to which a first voltage (VSSA) is applied.

The switch (S3) may be connected in series between a node (n1) and a terminal to which a first voltage (VSSA) is applied.

The switch (S4) and a current source may be connected in series between a node (n1) and a terminal to which a first voltage (VSSA) is applied.

The switch (S5) and a current source may be connected in series between a terminal to which a second voltage (VDDA) is applied and a node (n2).

The switch (S6) and a current source may be connected in series between a terminal to which a second voltage (VDDA) is applied and a node (n2).

The switch (S7) and a current course may be connected in series between a terminal to which a second voltage (VDDA) is applied and a node (n3).

The switch (S8) and a current source may be connected in series between a terminal to which a second voltage (VDDA) is applied and a terminal to which a first output signal (out+) is output.

The switch (S10) and a current source may be connected in series between a terminal to which a second voltage (VDDA) is applied and a terminal to which a first output signal (out+) is output.

The switch (S10) and a current source may be connected in series between a terminal to which a second voltage (VDDA) is applied and a terminal to which a first output signal (out+) is output.

The switch (S11) and a current source may be connected in series between a terminal to which a second voltage (VDDA) is applied and a terminal to which a second output signal (out−) is output.

The switch (S12) and a current source may be connected in series between a terminal to which a second voltage (VDDA) is applied and a terminal to which a second output signal (out−) is output.

The switch (S13) and a current source may be connected in series between a node (n6) and a terminal to which a first voltage (VSSA) is applied.

The switch (S14) and a current source may be connected in series between a node (n6) and a terminal to which a first voltage (VSSA) is applied.

The switches (S3, S6, S7, S10, S11 and S13) may be turned on and off in response to a first current control signal (QDL1). The switches (S4, S5, S8, S9, S12 and S14) may be turned on and off in response to a second current control signal (QDL2). The first current control signal (QDL1) and the second current control signal (QDL2) may be output from the controller (300, see FIG. 1). Specifically, a control signal output by the controller (300, see FIG. 1) may include the first current control signal (QDL1) and the second current control signal (QDL2).

Figure 7:
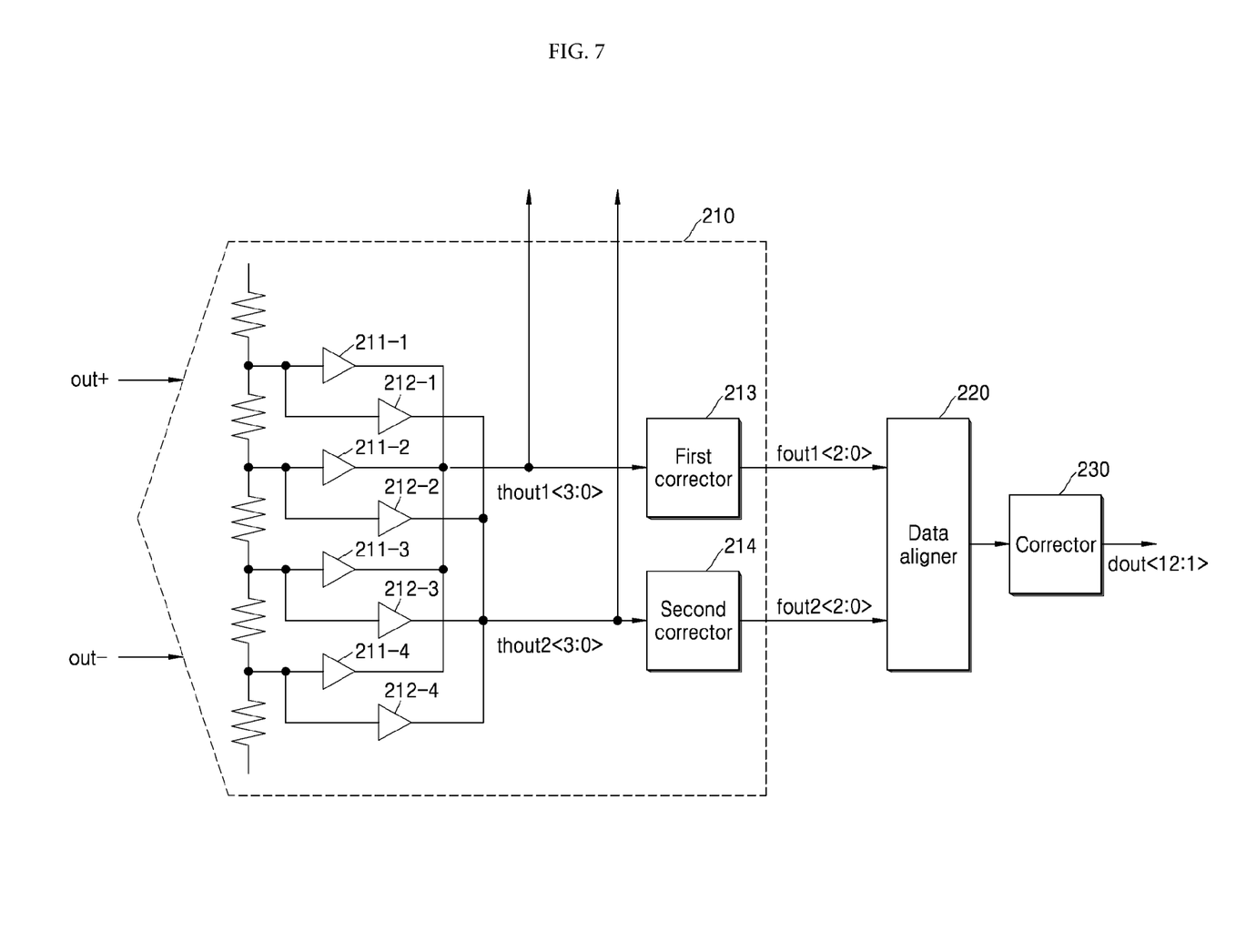
FIG. 7 is a view schematically showing a configuration of a flash conversion unit according to an embodiment that is provided in the analog-to-digital converter shown in FIG. 1.

FIG. 7 is a view schematically showing a configuration of a flash conversion unit 200 according to an embodiment that is provided in the analog-to-digital converter shown in FIG. 1. The flash conversion unit 200 may include a flash converter 210, a data aligner 220, and a corrector 230.

The flash converter 210 may receive input of a 1-1 output signal (out+) and a 1-2 output signal (out−), which are analog signals, and generate a 2-1 output signal (thout1<3:0>) and a 2-2 output signal (thout2<3:0>), which are digital signals. It may then correct an error of the 2-1 output signal (thout1<3:0>) and an error the 2-2 output signal (thout2<3:0>), and output a 3-1 output signal (fout1<2:0>) and a 3-2 output signal (fout2<2:0>). The flash converter 210 may sequentially output the 2-1 output signal (thout1<3:0>) and the 2-2 output signal (thout2<3:0>), but may repeatedly output them a predetermined number of times. In other words, when the amplification unit (140, see FIG. 1) outputs the 1-1 output signal (out+) and the 1-2 output signal (out−) by amplifying the first intermediate signal (in1), the flash converter 210 may output the 2-1 output signal (thout1<3:0>) and the 3-1 output signal (fout1<2:0>). When the amplification unit (140, see FIG. 1) outputs the 1-1 output signal (out+) and the 1-2 output signal (out−) by amplifying the second intermediate signal (in2), the flash converter 210 may output a 2-2 output signal (thout2<3:0>) and a 3-2 output signal (fout2<2:0>).

The flash converter 210 may include a plurality of resistors connected in series, a plurality of comparators 211-1 to 211-4 and 212-1 to 212-4, a first corrector 213 and a second corrector 214.

Each of the comparators 211-1 to 211-4 and 212-1 to 212-4 may compare a voltage of a corresponding node among the nodes between the resistors with a reference voltage, and may output comparison result. The comparators 211-1 to 211-4 may output a 2-1 output signal (thout1<3:0>) and the comparators 212-1 to 212-4 may output a 2-2 output signal (thout2<3:0>).

The first corrector 213 may correct an error of the 2-1 output signal (thout1<3:0>) and output a 3-1 output signal (fout1<2:0>). The second corrector 214 may correct an error of the 2-2 output signal (thout2<3:0>) and output a 3-2 output signal (fout2<2:0>).

The data aligner 220 may align and combine the 3-1 output signal (fout1<2:0>) and the 3-2 output signal (fout2<2:0>) to output them. The corrector 230 may correct an error of the output signal of the data aligner 220 and truncate the lowest bit to output an output code (dout<12:1>). As necessary, the corrector 230 may output an output code without the truncation of the lowest bit.

In FIG. 7, it is exemplified that each of the 2-1 output signal (thout1<3:0>) and the 2-2 output signal (thout2<3:0>) may be a 4-bit digital code and the output code (dout<12). However, the number of bits of each signal may be adjusted as necessary.

Figure 8:
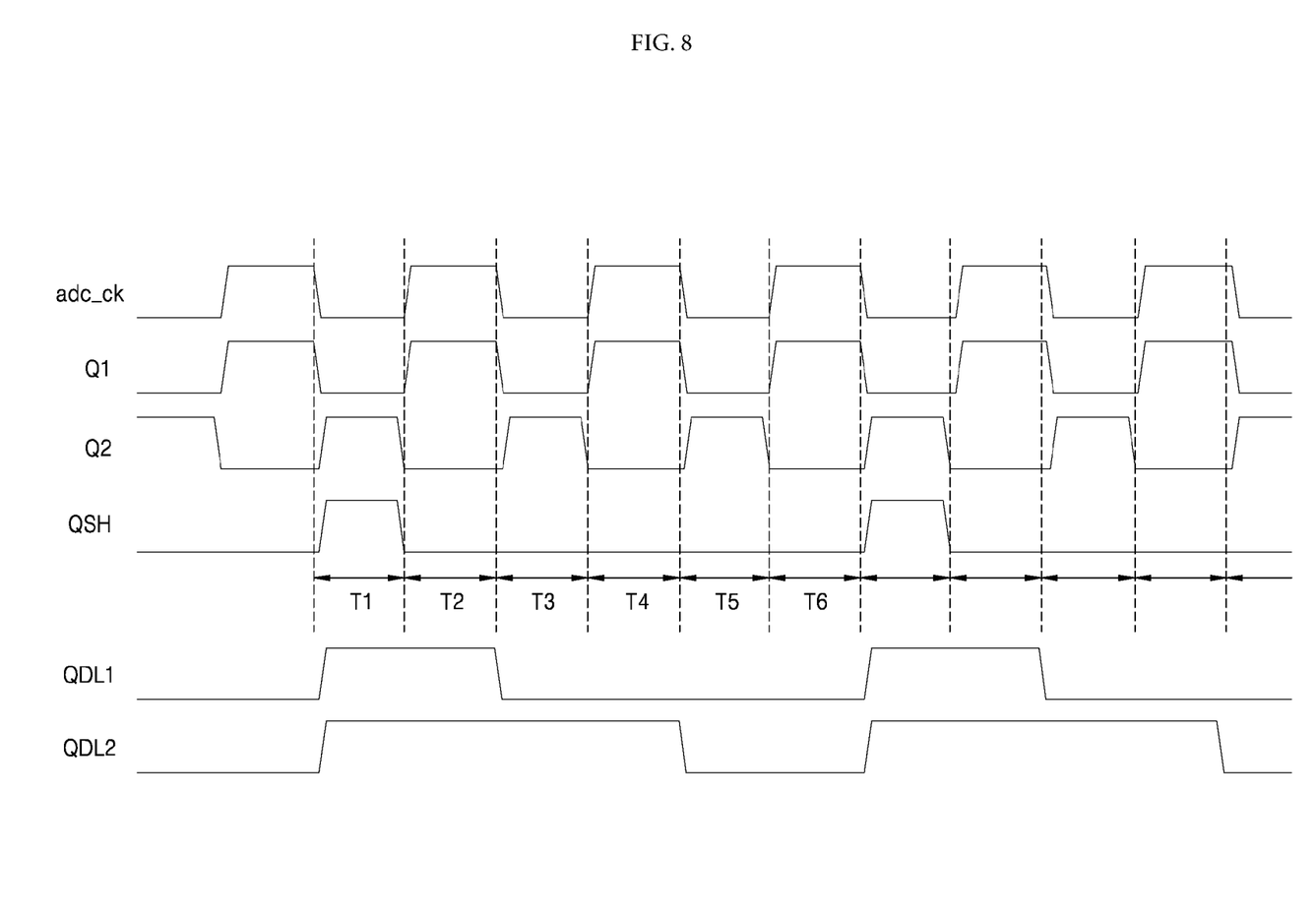
FIG. 8 is a timing diagram to explain the operation of the analog-to-digital converter according to an embodiment of the present disclosure.

FIG. 8 is a timing diagram to explain the operation of the analog-to-digital converter according to an embodiment of the present disclosure.

First, in a period T1, the selection control signal (QSH) may be at a high level. The selection unit (110 of FIGS. 1 and 2) may output an input signal (ins of FIG. 1, and ins+ and ins− of FIG. 2) as a selection input signal (ins of FIG. 1, and ins+ and ins− of FIG. 2). In periods T2 to T6, the selection control signal (QSH) may be a low level. Accordingly, the selection unit (110 of FIGS. 1 and 2) may output a first output signal (out of FIG. 1, and out+ and out− of FIG. 2) as a selection input signal (ins of FIG. 1, and ins+ and ins− of FIG. 2).

In a period T2, a first amplification control signal (Q1) may be a high level and a second amplification control signal (Q2) may be a low level. Accordingly, the amplification unit (140 of FIGS. 1 and 5) and/or the amplifier (142 of FIGS. 5 and 6) may amplify a second intermediate signal (in2 of FIG. 1 and in2+ and in2− of FIGS. 5 and 6) and then output a first output signal (out of FIG. 1 and out+ and out− of FIG. 2). The first output signal in the period T2 may be expressed as follows.

$$(out+,T2-out-,T2)=G\{(in+-in-)-((n,T1)*ref+-(m-n,T1)*ref-)\}$$

Here, out+, T2 and out−, T2 may be the first output signal of the period T2. G may be the gain of the amplifier and/or the amplifier. n, T1 may be the number of "1" of the second output signal (thout<3:0>) output in the period T1 and m may be the number of bits (in this instance, "4") of the second output signal (thout<3:0>).

In a period T3, a first amplification control signal (Q1) may be a low level and a second amplification control signal (Q2) may be a high level. Accordingly, the amplification unit (140 of FIGS. 1 and 5) and/or the amplifier (142 of FIGS. 5 and 6) may amplify a first intermediate signal (in1 of FIG. 1 and in1+ and in1− of FIGS. 5 and 6) and then output a first output signal (out of FIG. 1 and out+ and out− of FIG. 2). The first output signal in a period T3 may be expressed as follows.

(out+,T3−out−,T3)=G{(out+,T2−out−,T2)−((n,T2)*ref+−(m−n,T2)*ref−)}

Here, out+, T3 and out−, T3 may be the first output signal in the period T3. out+, T2 and out−, T2 may be first output signal. G may be the gain of the amplifier and/or the amplifier. n, T2 may be the number of "1" of the second output signal (thout<3:0>) output in the period T2 and m may be the number of bits (in this instance, "4") of the second output signal (thout<3:0>).

In a period T4, the first amplification control signal (Q1) may be a high level and the second amplification control signal (Q2) may be a low level. Accordingly, the amplification unit (140 of FIGS. 1 and 5) and/or the amplifier (142 of FIGS. 5 and 6) may amplify a second intermediate signal (in2 of FIG. 1 and in2+ and in2− of FIGS. 5 and 6) and then output a first output signal (out of FIG. 1 and out+ and out− of FIG. 2). The first output signal in the period T4 may be expressed as follows.

(out+,T4−out−,T4)=G{(out+,T3−out−,T3)−((n,T3)*ref+−(m−n,T3)*ref−)}

Here, out+, T4 and out−, T4 may be a first output signal in the period T4. Out+, T3 and out−, T3 may be first output signal in the period T3. G may be the gain of the amplification unit and/or the amplifier. n, T3 may be the number of "1" of the second output signal (thout<3:0>) output in the period T3 and m may be the number of bits (in this instance, "4") of the second output signal (thout<3:0>).

In a period T5, a first amplification control signal (Q1) may be a low level and a second amplification control signal (Q2) may be a high level. Accordingly, the amplification unit (140 of FIGS. 1 and 5) and/or the amplifier (142 of FIGS. 5 and 6) may amplify a first intermediate signal (in1 of FIG. 1 and in1+ and in1− of FIGS. 5 and 6) and then output a first output signal (out of FIG. 1 and out+ and out− of FIG. 2). The first output signal in a period T5 may be expressed as follows.

(out+,T5−out−,T5)=G{(out+,T4−out−,T4)−((n,T4)*ref+−(m−n,T4)*ref−)}

Here, out+, T5 and out−, T5 may be the first output signal in the period T5. out+, T2 and out−, T2 may be first output signal. G may be the gain of the amplifier and/or the amplifier. n, T4 may be the number of "1" of the second output signal (thout<3:0>) output in the period T2 and m may be the number of bits (in this instance, "4") of the second output signal (thout<3:0>).

In a period T6, the first amplification control signal (Q1) may be a high level and the second amplification control signal (Q2) may be a low level. Accordingly, the amplification unit (140 of FIGS. 1 and 5) and/or the amplifier (142 of FIGS. 5 and 6) may amplify a second intermediate signal (in2 of FIG. 1 and in2+ and in2− of FIGS. 5 and 6) and then output a first output signal (out of FIG. 1 and out+ and out− of FIG. 2). The first output signal in the period T4 may be expressed as follows.

(out+,T6−out−,T6)=G{(out+,T5−out−,T5)−((n,T5)*ref+−(m−n,T5)*ref−)}

Here, out+, T6 and out−, T6 may be a first output signal in the period T6. Out+, T5 and out−, T5 may be first output signal in the period T5. G may be the gain of the amplification unit and/or the amplifier. n, T5 may be the number of "1" of the second output signal (thout<3:0>) output in the period T5 and m may be the number of bits (in this instance, "4") of the second output signal (thout<3:0>).

In the period T1 and the period T2, a first current control signal (QDL1) and a second current control signal (QDL2) may be high levels. Accordingly, the switches (S3 to S14) of FIG. 6 may be turned on and many bias currents may be supplied to the amplifier (142 of FIG. 6).

In the period T3 and the period T4, a first current control signal (QDL1) may be a low level and a second current control signal (QDL2) may be a high level. Accordingly, the switches (S3, S6, S7, S10, S11 and S13) of FIG. 6 may be turned on and many bias currents may be supplied to the amplifier (142 of FIG. 6).

In the period T5 and the period T6, a first current control signal (QDL1) and a second current control signal (QDL2) may be high levels. Accordingly, the switches (S3 to S14) of FIG. 6 may be turned off and the relatively smallest amount of bias currents may be supplied to the amplifier (142 of FIG. 6).

Through such the configuration, power consumption of the analog-to-digital converter may be minimized.

The embodiments are described above with reference to a number of illustrative embodiments thereof. However, the present disclosure is not intended to limit the embodiments and drawings set forth herein, and numerous other modifications and embodiments can be devised by one skilled in the art. Further, the effects and predictable effects based on the configurations in the disclosure are to be included within the range of the disclosure though not explicitly described in the description of the embodiments.

The invention claimed is:

1. An analog-to-digital converter comprising:
an analog amplification unit configured to input an input signal and a reference signal and sequentially output a first output signal based on the input signal, a second output signal obtained by converting the first output signal into a digital value and the reference signal selected according to the digital value of the second output signal; and
a flash conversion unit configured to input the first output signal, output the second output signal, and generate and output an output code based on the second output signal,
wherein the analog amplification unit comprises:
a first input unit configured to output a first intermediate signal obtained by subtracting a value of the reference signal selected by the second output signal from the input signal;
a second input unit configured to output a second intermediate signal obtained by subtracting the value of the reference signal selected by the second output signal from the first output signal; and
an amplification unit configured to output the first output signal obtained by amplifying a difference between the first intermediate signal and the second intermediate signal.

2. The analog-to-digital converter of claim 1, wherein the analog amplification unit further comprises
a selection unit configured to output one of the input signal and the first output signal as a selection input signal in response to a selection control signal.

3. The analog-to-digital converter of claim 2, wherein the input signal comprises a first input signal and a second input signal that are mutually inverted,
wherein the first intermediate signal comprises an intermediate signal (in1+) and an intermediate signal (in1−) that are mutually inverted, wherein the reference signal comprises a first reference voltage and a second reference voltage that are mutually inverted, and wherein the first input unit comprises:

a plurality of first switches each having one end connected to a terminal to which the first reference voltage is applied and configured to be turned on and off in response to the second output signal;

a plurality of second switches each having one end connected to a terminal to which the second reference voltage is applied and configured to be turned on and off in response to the second output signal;

a plurality of first capacitors having one end connected to a terminal to which the first input signal is input and another end connect to the plurality of first switches and the plurality of second switches, and outputting the intermediate signal (in1+);

a plurality of third switches each having one end connected to a terminal to which the first reference voltage is applied and configured to be turned on and off in response to the second output signal;

a plurality of fourth switches each having one end connected to a terminal to which the second reference voltage is applied and configured to be turned on and off in response to the second output signal; and a plurality of second capacitors having one end connected to a terminal to which the second input signal is input and another end connected to the plurality of third switches and the plurality of fourth switches, and outputting the intermediate signal (in1−).

4. The analog-to-digital converter of claim 1, wherein the first out signal comprises an output signal (out+) and an output signal (out−) that are mutually inverted, wherein the second intermediate signal comprises an intermediate signal (in2+) and an intermediate signal (in2−) that are mutually inverted, wherein the reference signal comprises a first reference voltage and a second reference voltage that are mutually inverted, and wherein the second input unit, comprises:

a plurality of first switches each having one end connected to a terminal to which the first reference voltage is applied and configured to be turned on and off in response to the second output signal;

a plurality of second switches each having one end connected to a terminal to which the second reference voltage is applied and configured to be turned on and off in response to the second output signal;

a plurality of first capacitors having one end connected to a terminal to which output signal (out+) is input and another end connected to the plurality of first switches and the plurality of second switches, and outputting the intermediate signal (in2+);

a plurality of third switches each having one end connected to a terminal to which the first reference voltage is applied and configured to be turned on and off in response to the second output signal;

a plurality of fourth switches each having one end connected to a terminal to which the second reference voltage is applied and configured to be turned on and off in response to the second output signal; and a plurality of second capacitors having one end connected to a terminal to which the output signal (out−) is input and another end connected to the plurality of third switches and the plurality of fourth switches, and outputting the intermediate signal (in2−).

5. The analog-to-digital converter of claim 1, wherein the first intermediate signal comprises an intermediate signal (in1+) and an intermediate signal (in1−) that are mutually inverted, wherein the second intermediate signal comprises an intermediate signal (in2+) and an intermediate signal (in2−) that are mutually inverted, wherein the first output signal comprises an output signal (out+) and an output signal (out−) that are mutually inverted, wherein the amplification unit comprises:

an amplifier comprising a first input terminal to which the intermediate signal (in1+) is input, a second input terminal to which the intermediate signal (in1−) is input, a third input terminal to which the intermediate signal (in2+) is input, a fourth input terminal to which the intermediate signal is input (in2−), a first output terminal to which the output signal (out+) is output, and a second output terminal to which the output signal (out−) is output;

a first capacitor and a first switch that are connected in series between the first input terminal and the first output terminal;

a second capacitor and a second switch that are connected in series between the second input terminal and the second output terminal;

a third capacitor and a third switch that are connected in series between the third input terminal and the first output terminal; and a fourth capacitor and a fourth switch that are connected in series between the fourth input terminal and the second output terminal, and wherein the first switch and the second switch are turned on in odd numbered time periods and turned off in even numbered time periods, and the third switch and the fourth switch are turned off in the odd numbered time periods and turned on in the even numbered time periods.

6. The analog-to-digital converter of claim 5, wherein the amplifier comprises:

a folded cascade amplification circuit configured to amplify a difference between the intermediate signal (in1+) and the intermediate signal (in1−) in the even numbered time periods and a difference between the intermediate signal (in2+) and the intermediate signal (in2−) in the odd numbered time periods and output the amplified difference; and a common sources amplification circuit configured to amplify an output signal of the folded cascade amplification circuit and output the output signal (out+) and the output signal (out−).

7. The analog-to-digital converter of claim 6, wherein the folded cascade amplification circuit comprises:

an input end circuit configured to vary signals of intermediate nodes in response to the intermediate signal (in1+) and the intermediate signal (in1−) in the even numbered time periods and vary the signals of the intermediate nodes in response to the intermediate signal (in2+) and the intermediate signal (in2−) in the odd numbered time periods; and an output end circuit configured to amplify and output a voltage difference between the intermediate nodes.

8. The analog-to-digital converter of claim 7, wherein the input end circuit comprises:

a first transistor connected between a terminal to which a first voltage is applied and a first node;

a first switch having one end connected to the first node and configured to be turned on in the even numbered time periods and turned off in the odd numbered time periods:

a second transistor connected between another end of the first switch of the input end circuit and a second node, and comprising a gate to which the intermediate signal (in1+) is applied;

a third transistor connected between the another end of the first switch of the input end circuit and a third node, and configured to have the intermediate signal (in1−) applied thereto;

a second switch having one end connected to the first node and configured to be turned on in the odd numbered time periods and turned off in the even numbered time periods;

a fourth transistor connected between another end of the second switch of the input end circuit and the third node, and comprising a gate to which the intermediate signal (in2+) is applied; and a fifth transistor connected between the another end of the second switch of the input end circuit and the second node, and comprising a gate to which the intermediate signal (in2−) is applied.

9. The analog-to-digital converter of claim 8, wherein the input end circuit further comprises a current source and a third switch that are connected in series between the first node and the terminal to which the first voltage is input.

10. The analog-to-digital converter of claim 8, wherein the output end circuit comprises:

a sixth transistor connected between a terminal to which the second voltage is applied and the second node;

a seventh transistor connected between the terminal to which the second voltage is applied and the third node;

an eighth transistor connected between the second node and a fourth node;

a ninth transistor connected between the third node and a fifth node;

a tenth transistor connected between the fourth node and the terminal to which the first voltage is applied; and an eleventh transistor connected between the fifth node and the terminal to which the first voltage is applied.

11. The analog-to-digital converter of claim 10, wherein the output end circuit further comprises:

a third switch connected in series between the terminal to which the second voltage is applied and the second node; and a fourth switch connected in series between the terminal to which the second voltage is applied and the third node.

12. The analog-to-digital converter of claim 10, wherein the common source amplification circuit comprises:

a twelfth transistor connected between the terminal to which the second voltage is applied and the first output terminal to which the output signal (out+) is output;

a thirteenth transistor connected between the terminal to which the second voltage is applied and the second output terminal to which output signal (out−) is output;

a fourteenth transistor connected between the first output terminal to which the output signal (out+) is output and a sixth node, and comprising a gate to which a signal of the fourth node is applied;

a fifteenth transistor connected between the second output terminal to which the output signal (out−) is output and the sixth node; and a sixteenth transistor connected between the sixth node and the terminal to which the first voltage is applied.

13. The analog-to-digital converter of claim 12, wherein the common source amplification circuit further comprises:

a first current source and a third switch that are connected in series between the terminal to which the second voltage is applied and the first output terminal to which the output signal (out+) is output; and a second current source and a fourth switch that are connected in series between the terminal to which the second voltage is applied and the second output terminal to which the output signal (out−) is output.

14. The analog-to-digital converter of claim 12, wherein the common source amplification circuit further comprises a first current source and a third switch that are connected in series between the terminal to which the first voltage is applied and the sixth node.

15. The analog-to-digital converter of claim 1, wherein the flash conversion unit comprises a flash converter, a data aligner and a corrector.

16. The analog-to-digital converter of claim 15, wherein the flash converter includes a plurality of resistors connected in series, a plurality of comparators, a first corrector and a second corrector.

* * * * *